(12) United States Patent
Yin et al.

(10) Patent No.: US 7,994,588 B2
(45) Date of Patent: Aug. 9, 2011

(54) INVERTED NONVOLATILE MEMORY DEVICE, STACK MODULE, AND METHOD OF FABRICATING THE SAME

(75) Inventors: Huaxiang Yin, Yongin-si (KR); Young-soo Park, Yongin-si (KR); Sun-Il Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 252 days.

(21) Appl. No.: 12/073,398

(22) Filed: Mar. 5, 2008

(65) Prior Publication Data

US 2009/0057745 A1 Mar. 5, 2009

(30) Foreign Application Priority Data

Aug. 29, 2007 (KR) .................. 10-2007-0087306

(51) Int. Cl.
*H01L 21/70* (2006.01)

(52) U.S. Cl. ........ 257/390; 257/314; 257/315; 257/318; 257/E29.3; 257/E21.422; 257/E21.662; 257/E21.679; 257/E29.309; 438/211; 438/257; 438/593

(58) Field of Classification Search .................... 257/71, 257/235, 239, 250, 296, 298, 300, 314–315, 257/318, 347, 401, E27.009, E29.126, E29.127, 257/E29.128, E29.129, E29.3, E29.291, E29.294, 257/E21.409, E21.422, 390, E21.662, E21.679, 257/E29.309; 438/151, 200, 201, 211, 257, 438/593, FOR. 203
See application file for complete search history.

(56) References Cited

U.S. PATENT DOCUMENTS

| 6,285,055 | B1 * | 9/2001 | Gosain et al. | 257/317 |
| 2001/0030324 | A1 * | 10/2001 | Morikawa et al. | 257/59 |
| 2006/0043377 | A1 * | 3/2006 | Hoffman et al. | 257/72 |

* cited by examiner

*Primary Examiner* — N Drew Richards
*Assistant Examiner* — Yu-Hsi Sun
(74) *Attorney, Agent, or Firm* — Harness, Dickey & Pierce, P.L.C.

(57) ABSTRACT

Example embodiments provide a nonvolatile memory device that may be integrated through stacking, a stack module, and a method of fabricating the nonvolatile memory device. In the nonvolatile memory device according to example embodiments, at least one bottom gate electrode may be formed on a substrate. At least one charge storage layer may be formed on the at least one bottom gate electrode, and at least one semiconductor channel layer may be formed on the at least one charge storage layer.

29 Claims, 11 Drawing Sheets

INVERTED NONVOLATILE MEMORY DEVICE, STACK MODULE, AND METHOD OF FABRICATING THE SAME

FOREIGN PRIORITY STATEMENT

This application claims priority under 35 U.S.C. §119 to Korean Patent Application No. 10-2007-0087306, filed on Aug. 29, 2007, in the Korean Intellectual Property Office, the entire contents of which are incorporated herein by reference.

BACKGROUND

1. Field

Example embodiments relate to a semiconductor device, and more particularly, to a nonvolatile memory device, a stack module, and a method of manufacturing the same.

2. Description of Related Art

Semiconductor products may be required to handle a large capacity of data while having a small size. Accordingly, increased operation speed and/or integration density of a non-volatile memory device used for semiconductor products may be desirable.

A nonvolatile memory device may be conventionally formed by stacking a floating gate electrode and a control gate electrode on a bulk semiconductor substrate. However, the increase in the capacity and speed of a planar-type nonvolatile memory device may be limited by constraints of integration techniques.

In response to these constraints, a three-dimensional non-volatile memory device has been manufactured using a bulk semiconductor substrate or a silicon-on-insulator (SOI) substrate. A conventional three-dimensional nonvolatile memory device may include a fin-structure channel, and may be used as a high performance device.

SUMMARY

Example embodiments provide a nonvolatile memory device that may be made more highly integrated through stacking.

Example embodiments also provide a stack module.

Example embodiments also provide a method of fabricating the nonvolatile memory device.

According to example embodiments, a nonvolatile memory device having an inverted structure may include at least one bottom gate electrode formed on a substrate, at least one charge storage layer formed on the at least one bottom gate electrode, and at least one semiconductor channel layer formed on the at least one charge storage layer.

The nonvolatile memory device may further include at least one source electrode and at least one drain electrode separately electrically connected to the at least one semiconductor channel layer.

The nonvolatile memory device may further include at least one tunneling insulating layer between the at least one semiconductor channel layer and the at least one charge storage layer, and at least one blocking insulating layer between the at least one charge storage layer and the at least one bottom gate electrode.

The at least one charge storage layer may be a floating gate type or a charge-trap type.

The at least one bottom gate electrode may include a plurality of bottom gate electrodes separated from each other on the substrate, and the at least one semiconductor channel layer may include a plurality of semiconductor channel layers disposed on the bottom gate electrodes. The nonvolatile memory device may further include a plurality of source electrodes and drain electrodes separately electrically connected to both sides of the semiconductor channel layers.

Example embodiments also provide a stack module in which a plurality of nonvolatile memory devices are stacked.

Example embodiments also provide a method of fabricating a nonvolatile memory device that may include forming at least one bottom gate electrode on a substrate, forming at least one charge storage layer on the at least one bottom gate electrode, and forming at least one semiconductor channel layer on the at least one charge storage layer.

After forming the at least one semiconductor channel layer, the method may further include forming at least one source electrode and at least one drain electrode to be electrically connected to both sides of the at least one charge storage layer.

Prior to forming the at least one charge storage layer, the method may further include forming at least one blocking insulating layer on the at least one bottom gate electrode. Also, prior to forming the at least one semiconductor channel layer, the method may further include forming at least one tunneling insulating layer on the at least one charge storage layer.

A nonvolatile memory device according to example embodiments may have an inverted structure, and may be suitable for a three-dimensional structure. Accordingly, a stack structure in which the nonvolatile memory devices are stacked may have higher integration density in the same plane and may have a larger memory capacity.

The nonvolatile memory device according to example embodiments may be operated as a virtual ground device using bias lines, for example. The nonvolatile memory device may have a NOR structure, an AND, NAND, or NROM structure that is operated using FN tunneling. Accordingly, the nonvolatile memory device may have a higher programming and/or erasing efficiency.

The nonvolatile memory device according to example embodiments may extend a stack module in which memory cells are vertically stacked. Furthermore, the nonvolatile memory device according to example embodiments may be less expensive than an SOI substrate used by a conventional three-dimensional nonvolatile memory devices. The nonvolatile memory device and the stack module according to example embodiments may be fabricated without using an SOI substrate or bonding technique.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
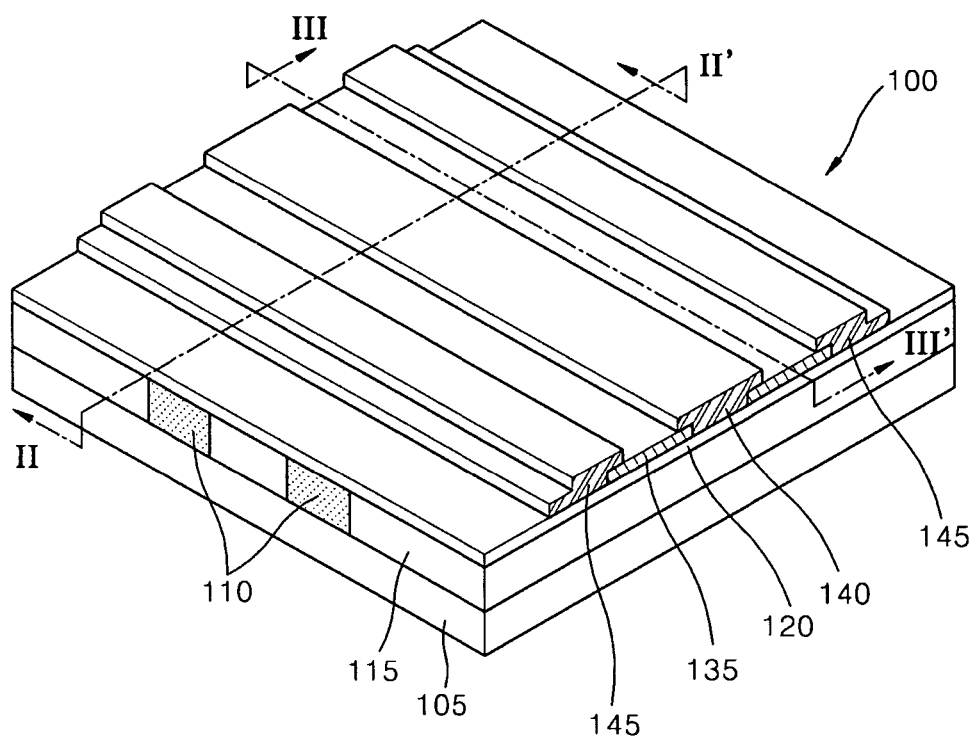
FIG. 1 is a schematic perspective view of a nonvolatile memory device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
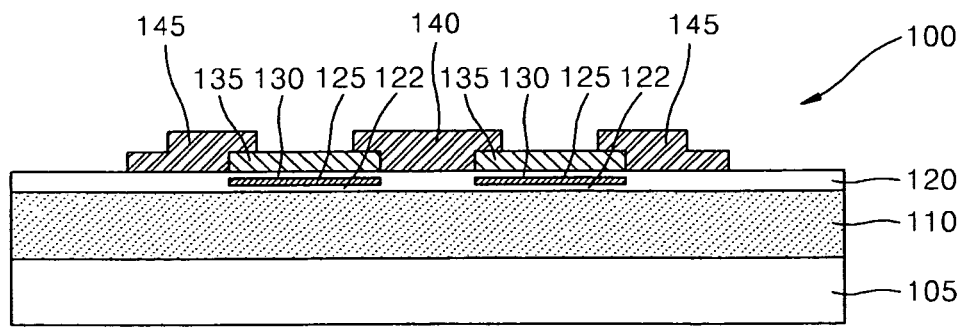
FIG. 2 is a cross-sectional view taken along line II-II' of FIG. 1.

FIG. 1 is a schematic perspective view of a nonvolatile memory device 100 according to example embodiments. FIG. 2 is a cross-sectional view taken along line II-II' of FIG. 1 and FIG. 3 is a cross-sectional view taken along line III-III' of FIG. 1.

Figure 3:
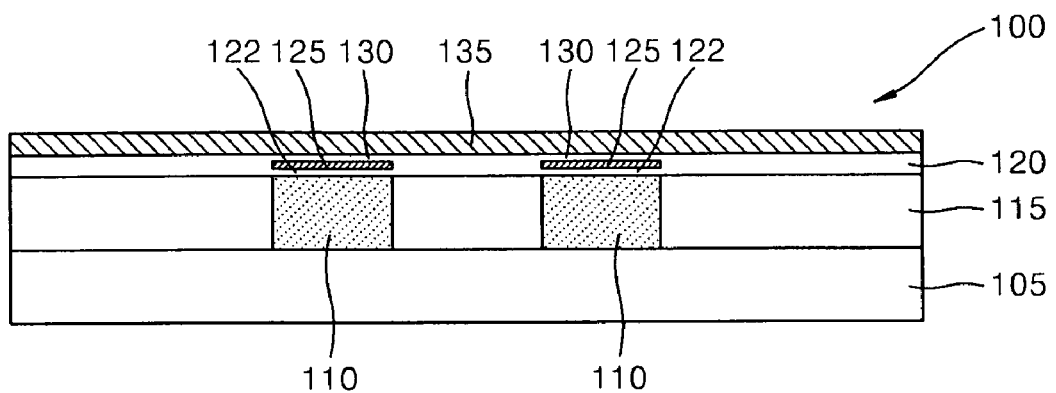
FIG. 3 is a cross-sectional view taken along line III-III' of FIG. 1.

Referring to FIGS. 1 through 3, a plurality of bottom gate electrodes 110 may be provided on a substrate 105. The substrate 105 may be formed entirely of an insulating material or may have a structure in which an insulating material is deposited or coated on a semiconductor wafer, for example. A lower insulating layer 115 may be provided so as to fill spaces between the bottom gate electrodes 110.

The bottom gate electrodes 110 may be separated from each other on the substrate 105. The bottom gate electrodes 110 may be used as word lines, for example, and may further be appropriately disposed according to the structure of the nonvolatile memory device 100. Thus, a direction in which the bottom gate electrodes 110 extend may be referred to as a word line direction.

Example embodiments provide that, if the nonvolatile memory device 100 has an NROM structure or an AND structure, the bottom gate electrodes 110 may be disposed in a line-type on the substrate 105. In this example, memory cells coupled with each of the bottom gate electrodes 110 may share a word line. Further, if the nonvolatile memory device 100 is formed of one memory cell, one bottom gate electrode 110 may be provided on the substrate 105. Thus, the number of bottom gate electrodes 110 may vary with example embodiments, and may be selected according to the memory capacity of the nonvolatile memory device 100, or otherwise as appropriate.

A plurality of charge storage layers 125 may be provided on the bottom gate electrodes 110. The charge storage layers 125 may be used for data programming by storing charges. The charge storage layers 125 may be of a floating gate type and may be referred to as floating gate electrodes. The charge storage layers 125 may include a conductive layer, which may be a poly-silicon or a metal. Further, the charge storage layers 125 may be disposed apart from each other.

The number of the charge storage layers 125 may be selected according to the memory capacity of the nonvolatile memory device 100, or otherwise as appropriate. Example embodiments provide that, if the nonvolatile memory device 100 is formed of a unit cell, one charge storage layer 125 may be provided on one bottom gate electrode 110. Additional example embodiments provide that, if the nonvolatile memory device 100 has a cell array structure, the charge storage layers 125 may be arranged in an array type on the bottom gate electrodes 110.

A plurality of semiconductor channel layers 135 may be separately disposed on the charge storage layers 125. The semiconductor channel layers 135 may function as conductive paths of charges when the nonvolatile memory device 100 is operated. The semiconductor channel layers 135 may cross the bottom gate electrodes 110, and the number of the semiconductor channel layers 135 may be selected as appropriate, and for example may be selected according to the memory capacity of the nonvolatile memory device 100. For example, the semiconductor channel layer 135 may be provided in a single semiconductor channel layer 135 or the semiconductor channel layers 135 may be provided in an array type.

The semiconductor channel layers 135 may include a semiconductor oxide. The semiconductor oxide may be a zinc oxide (for example, ZnO), a tin oxide (for example, $SnO_2$), an indium tin oxide (for example, ITO), an indium zinc oxide (for example, IZO), a copper oxide (for example, CuO), a nickel oxide (for example, NiO), a titanium oxide (for example, $TiO_2$), a (aluminium, gallium, or indium)-doped zinc oxide (ZnO), a (nitrogen, phosphorus, arsenic)-doped zinc oxide (ZnO), or an amorphous gallium indium zinc oxide (GIZO) (for example, $Ga_2O_3$—$In_2O_3$—ZnO). Additional example embodiments provide that the semiconductor channel layers 135 may include amorphous silicon, monocrystal silicon, a poly-silicon, an epitaxial silicon, germanium (Ge) or a polymer.

In example embodiments where the semiconductor channel layers 135 include poly-silicon, a plurality of layers may be easier to stack, but the poly-silicon may have crystal defects. Example embodiments of semiconductor channel layers 135 including monocrystal silicon may not be easy to stack and may incur costs if a bonding structure is used. Example embodiments of semiconductor channel layers 135 including semiconductor oxides may be easier to stack and may have fewer crystal defects.

The semiconductor channel layers 135, the charge storage layers 125, and the bottom gate electrodes 110 may be insulated from each other by an interlayer insulating layer 120. For example, a plurality of blocking insulating layers 122 may be interposed between the bottom gate electrodes 110 and the charge storage layers 125, and a plurality of tunneling insulating layers 130 may be interposed between the charge storage layers 125 and the semiconductor channel layers 135. The blocking insulating layers 122 and the charge storage layers 125 may constitute one interlayer insulating layer 120 when they are not separated from each other or may be formed of different materials so as to be separated from each other.

The tunneling insulating layers 130 may be formed of an appropriate material and to an appropriate thickness in order to allow charge tunneling between the charge storage layers 125 and the semiconductor channel layers 135. The blocking insulating layers 122 may be formed of a material and to a thickness so that charges stored in the charge storage layers 125 cannot be reverse tunneled to the bottom gate electrodes 110. For example, the tunneling insulating layers 130 and the blocking insulating layers 122 may be formed in a single layer or a multiple layer using an oxide, a nitride, or a high-K dielectric material.

The high-K dielectric material may refer to an insulating material having a dielectric constant higher than an oxide or a nitride. For example, the high-K dielectric material may include a hafnium oxide (for example, $HfO_2$), a hafnium-silicon oxide (for example, HfSiO), an aluminum oxide ($Al_2O_3$), a titanium oxide (for example, $TiO_2$), a tantalum oxide (for example, $Ta_2O_5$), and a zirconium oxide (for example, $ZrO_2$).

At least one source electrode 140 and at least one drain electrode 145 may be disposed on the interlayer insulating layer 120, and may be electrically connected on both side surfaces of the semiconductor channel layers 135. The source electrode 140 and the drain electrode 145 may be extended across the bottom gate electrodes 110. For example, the source electrode 140 and the drain electrode 145 may cover side surfaces of the semiconductor channel layers 135 and may further be extended on the semiconductor channel layers 135.

The source electrode 140 and the drain electrode 145, which may be disposed between the semiconductor channel layers 135. The source electrode 140 and the drain electrode 145 may be shared by the semiconductor channel layers 135 disposed on both sides of each of the source electrode 140 and the drain electrode 145. The source electrode 140 and the drain electrode 145 may function inversely to each other, for example according to power applied to the nonvolatile memory device 100. Example embodiments of the source electrode 140 and the drain electrode 145 may be formed of a material selected from a group including IZO, ITO, Ti/Au, Mo, Ru, Al, Pt/Ti, Al/Au, and Cu.

In the nonvolatile memory device 100 according to example embodiments, the semiconductor channel layers 135 may be disposed above the bottom gate electrodes 110. Since this structure is opposite to a conventional disposition of a flash memory device in which a control gate electrode is disposed on a semiconductor substrate, the nonvolatile memory device 100 may be considered to have an inverted structure. In an inverted structure according to example embodiments, the semiconductor channel layers 135 may be formed in a thin film structure without using a bulk semiconductor substrate. Thus, the nonvolatile memory device 100 may be suitable for a three-dimensional type stacking structure.

Figure 4:
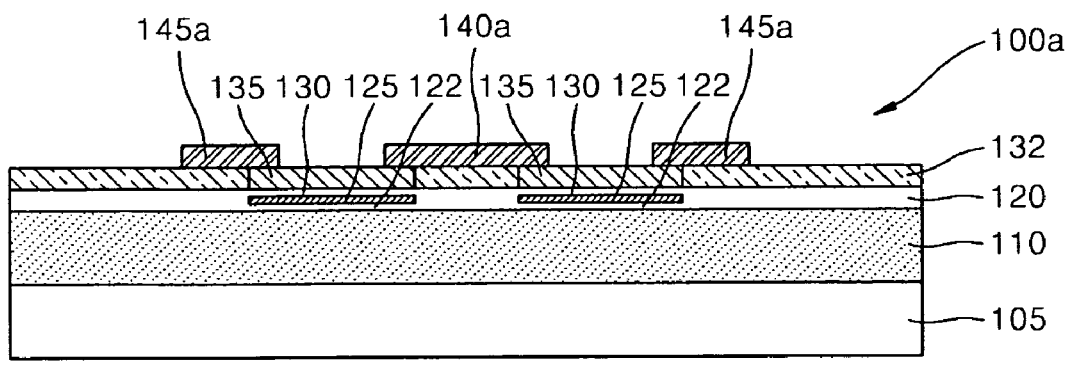
FIG. 4 is a cross-sectional view of a modified version of the nonvolatile memory device of FIG. 2 according to example embodiments.

FIG. 4 is a cross-sectional view of a modified version of the nonvolatile memory device of FIG. 2 according to example embodiments.

Referring to FIG. 4, a source electrode 140a and a drain electrode 145a may be separately disposed on semiconductor channel layers 135. A separation insulating layer 132 may be interposed between the semiconductor channel layers 135. The source electrode 140a and the drain electrode 145a may be extended on the separation insulating layer 132 from both edges of the semiconductor channel layers 135. The structure of the source electrode 140a and the drain electrode 145a may be simplified by planarizing the separation insulating layer 132.

Figure 5:
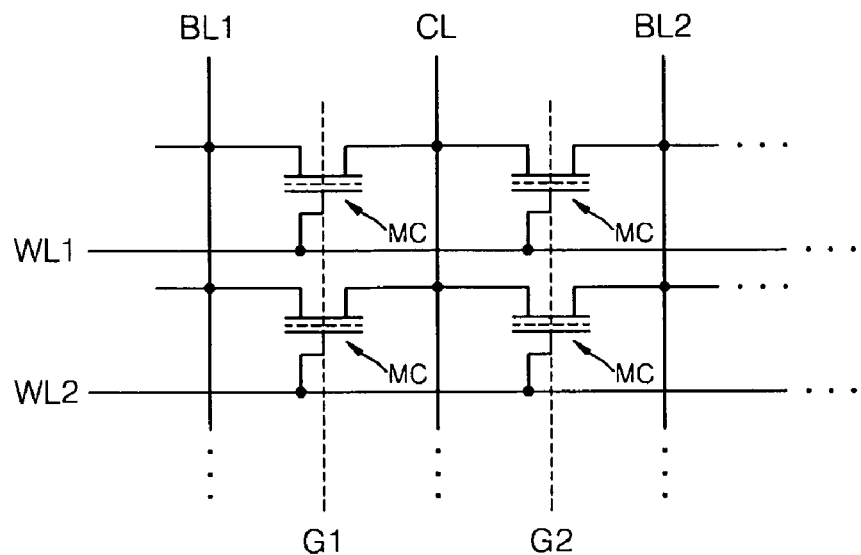
FIG. 5 is an equivalent circuit of the nonvolatile memory device of FIG. 1 according to example embodiments.

FIG. 5 is an equivalent circuit of the nonvolatile memory device 100 of FIG. 1 according to example embodiments.

Referring to FIGS. 1 through 5, the bottom gate electrodes 110 may correspond to word lines WL1 and WL2. The source electrode 140 may correspond to a common line CL, and the drain electrodes 145 may correspond to bit lines BL1 and BL2. A stacking structure of the bottom gate electrodes 110, the charge storage layers 125, and the semiconductor channel layers 135 may correspond to memory cells MC. The semiconductor channel layers 135 may be used as a portion of bias lines G1 and G2. The quantities of the bit lines BL1 and BL2 and the word lines WL1 and WL2 are representative of example embodiments, and these quantities are not limited to the example embodiments cited herein.

The nonvolatile memory device 100 may be operated as a virtual ground device using the bias lines G1 and G2, and the bias lines G1 and G2 may be used for grounding the semiconductor channel layers 135 during programming and/or erasing operation of the nonvolatile memory device 100. The nonvolatile memory device 100 may be used for a NOR structure, as well as an AND, NAND, or NROM structure that is operated using FN tunneling. Accordingly, the programming and erasing efficiency of the nonvolatile memory device 100 may be increased.

Example embodiments of the programming, reading, and erasing operations of the memory cells MC may be the same as the operations of a conventional flash memory device. For example, the programming operation may be performed using channel-hot electron injection or FN tunneling, and the erasing operation may be performed using FN tunneling.

Thus, the nonvolatile memory device 100 may use the semiconductor channel layers 135 as the bias lines G1 and G2 while the nonvolatile memory device 100 is used in a three-dimensional stacking structure, and the integration density of the nonvolatile memory device 100 may be increased.

Figure 6:
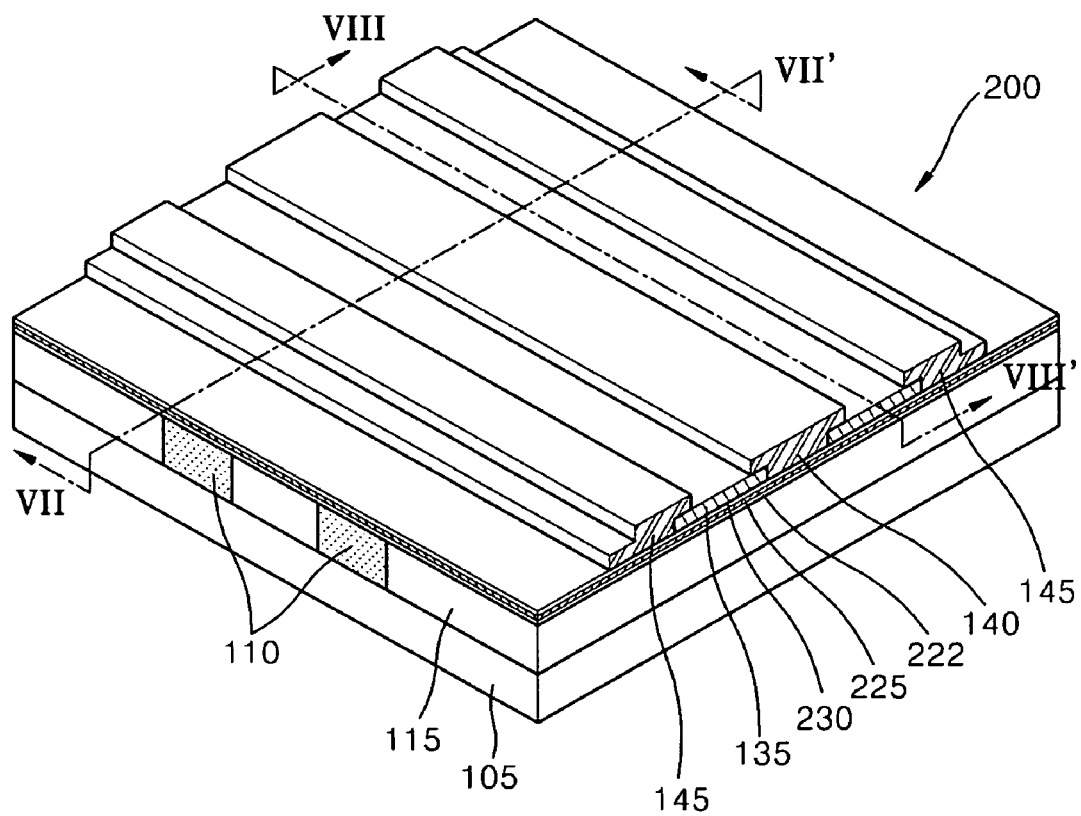
FIG. 6 is a schematic perspective view of a nonvolatile memory device according to example embodiments.
Figure 7:
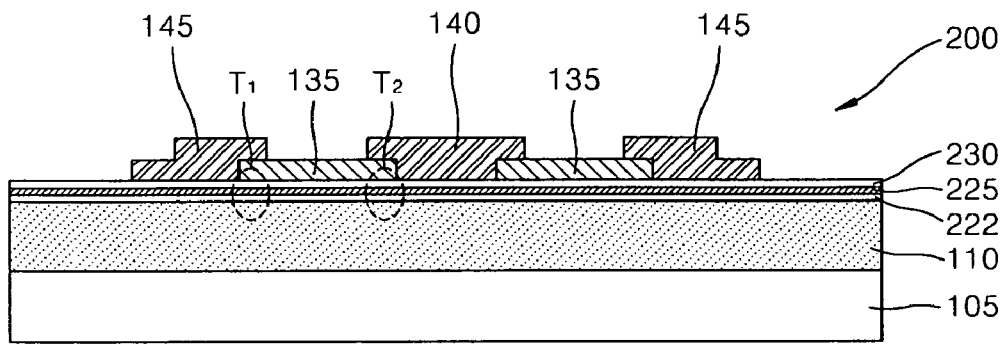
FIG. 7 is a cross-sectional view taken along line VII-VII' of FIG. 6.
Figure 8:
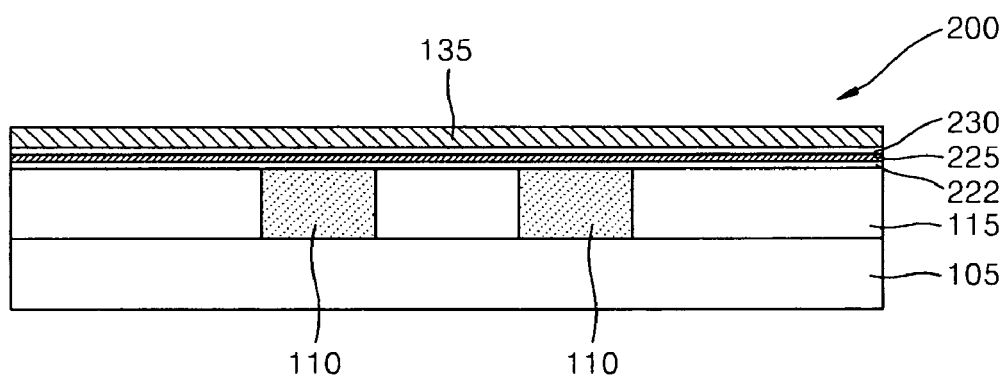
FIG. 8 is a cross-sectional view taken along line VIII-VIII' of FIG. 6.

FIG. 6 is a schematic perspective view of a nonvolatile memory device 200 according to example embodiments. FIG. 7 is a cross-sectional view taken along line VII-VII' of FIG. 6, and FIG. 8 is a cross-sectional view taken along line VIII-VIII' of FIG. 6. Since the nonvolatile memory device 200 is a modified version of the nonvolatile memory device 100 of FIGS. 1 through 3, the description of identical items will not be repeated. The equivalent circuit of FIG. 5 may be used as an example embodiment of the equivalent circuit of the nonvolatile memory device 200.

Referring to FIGS. 6 through 8, a charge storage layer 225 may be provided in a charge-trap type. For example, the charge storage layer 225 may be provided as one layer on a substrate 105. Thus, the charge storage layer 225 may not be separated from each other in memory cells MC. Since the charge storage layer 225 can locally trap charges, charges stored in the memory cells MC may be locally fixed on corresponding charge trap locations. Accordingly, although the charge storage layer 225 is provided as a single layer, charges of the memory cells MC may be separated from each other.

Furthermore, the charge storage layer 225 may include trap sites $T_1$ and $T_2$ separated in left and right sides in one memory cell MC. In example embodiments, 1 bit of data may be stored using the left trap site $T_1$ and another 1 bit of data may be stored using the right trap site $T_2$. These two bit data may be read using a forward direction reading operation and a reverse direction reading operation. Thus, the nonvolatile memory device 200 may treat two bit data using one memory cell MC.

For example, the charge storage layer 225 may include silicon nitrides, nanocrystals, or quantum dots having charge trap sites. The nanocrystals or quantum dots may include structures of silicon or metal for charge trapping.

Alternative example embodiments provide that a plurality of charge storage layers 225 having a charge-trap type separated from each other may be disposed along the memory cells MC as in FIG. 2.

A blocking insulating layer 122 may be interposed between the charge storage layer 225 and the bottom gate electrodes 110. A tunneling insulating layer 230 may be interposed between the charge storage layer 225 and the semiconductor channel layers 135.

Figure 9:
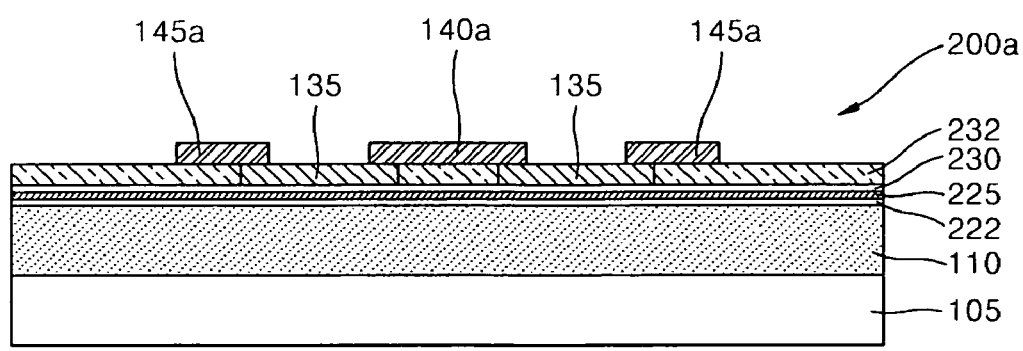
FIG. 9 is a cross-sectional view of a modified version of the nonvolatile memory device of FIG. 7 according to example embodiments.

FIG. 9 is a cross-sectional view of a modified version of the nonvolatile memory device 200a corresponding to the nonvolatile memory device 200 of FIG. 7, according to example embodiments.

Referring to FIG. 9, a source electrode 140a and a drain electrode 145a may be separately disposed on semiconductor channel layers 135. A separation insulating layer 232 may be interposed between the semiconductor channel layers 135. The source electrode 140a and the drain electrode 145a may be extended on the separation insulating layer 232 from both edges of the semiconductor channel layers 135. The structure of the source electrode 140a and the drain electrode 145a may be simplified by planarizing the separation insulating layer 232.

FIGS. 10 through 14 are schematic perspective views for explainig example embodiments of a method of fabricating a nonvolatile memory device 100.

Figure 10:
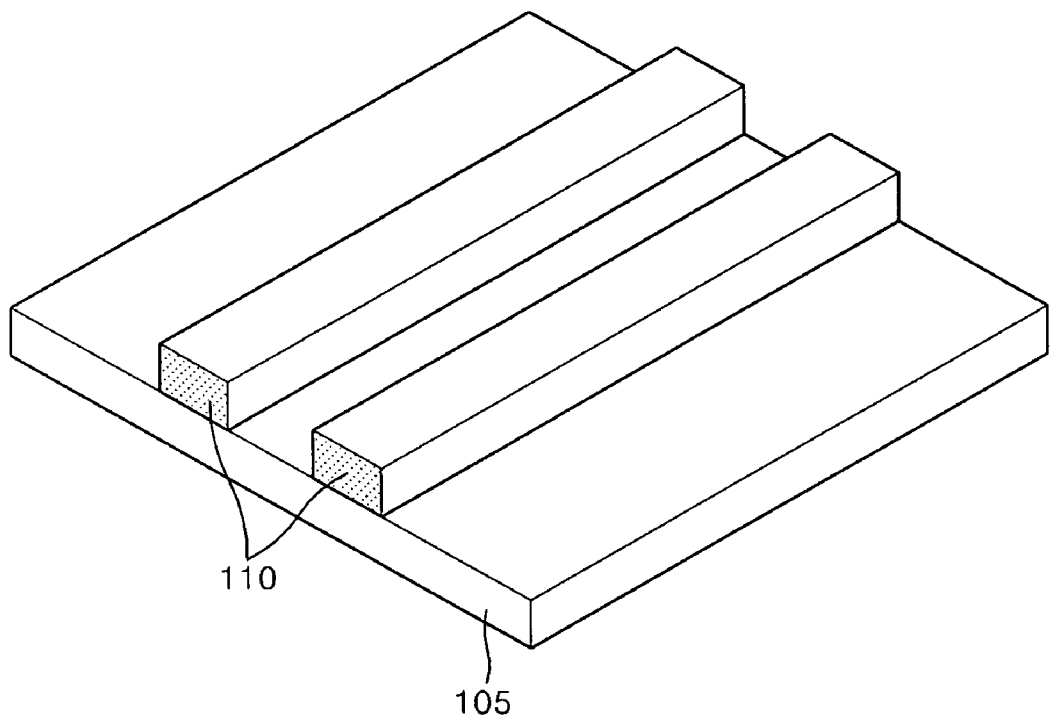
FIGS. 10 through 14 are schematic perspective views for explaining a method of fabricating a nonvolatile memory device according to example embodiments.

Referring to FIG. 10, at least one bottom gate electrode 110 may be formed on a substrate 105. The substrate 105 may include a structure in which the entire substrate 105 is formed of an insulating material or an insulating material may be deposited or coated on a semiconductor wafer. The bottom gate electrodes 110 may be formed by patterning a conductive layer deposited on the substrate 105. For example, the conductive layer may be formed of poly-silicon, Mo, Pt, Ni, IZO, Al, or W.

Figure 11:
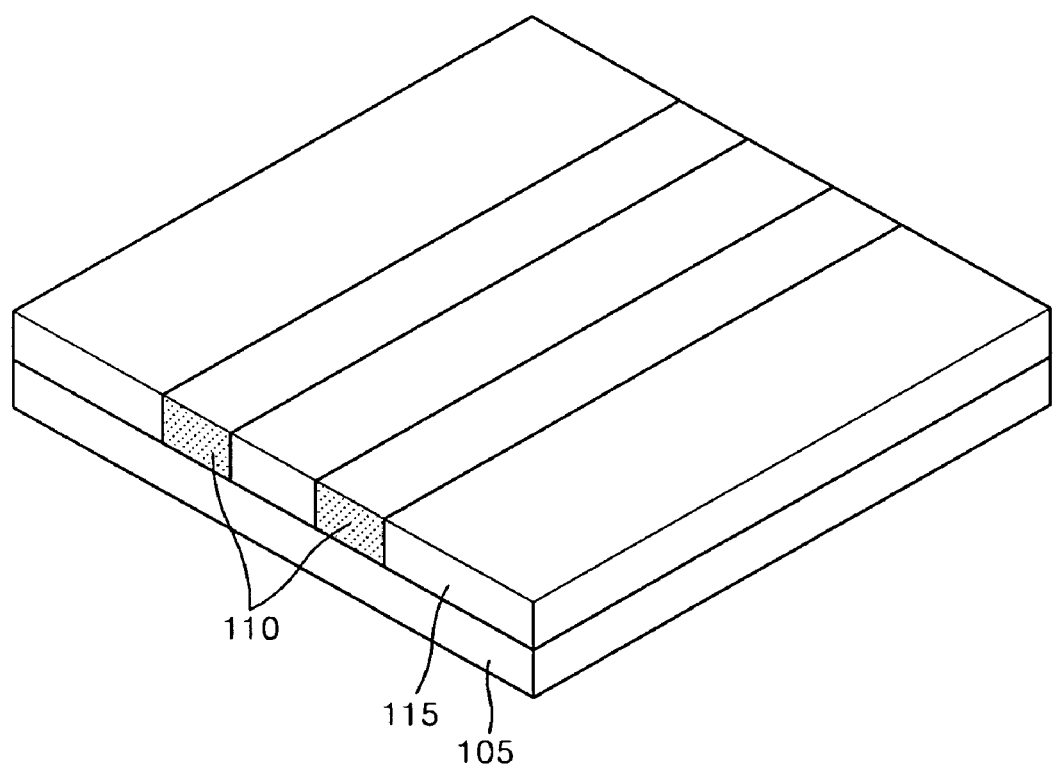

Referring to FIG. 11, a lower insulating layer 115 that fills spaces between the bottom gate electrodes 110 may be formed. For example, the lower insulating layer 115 may be formed by planarizing an insulating layer deposited on the bottom gate electrodes 110. The planarization of the insulating may be achieved using chemical mechanical polishing (CMP), etch-back, or other methods.

Figure 12:
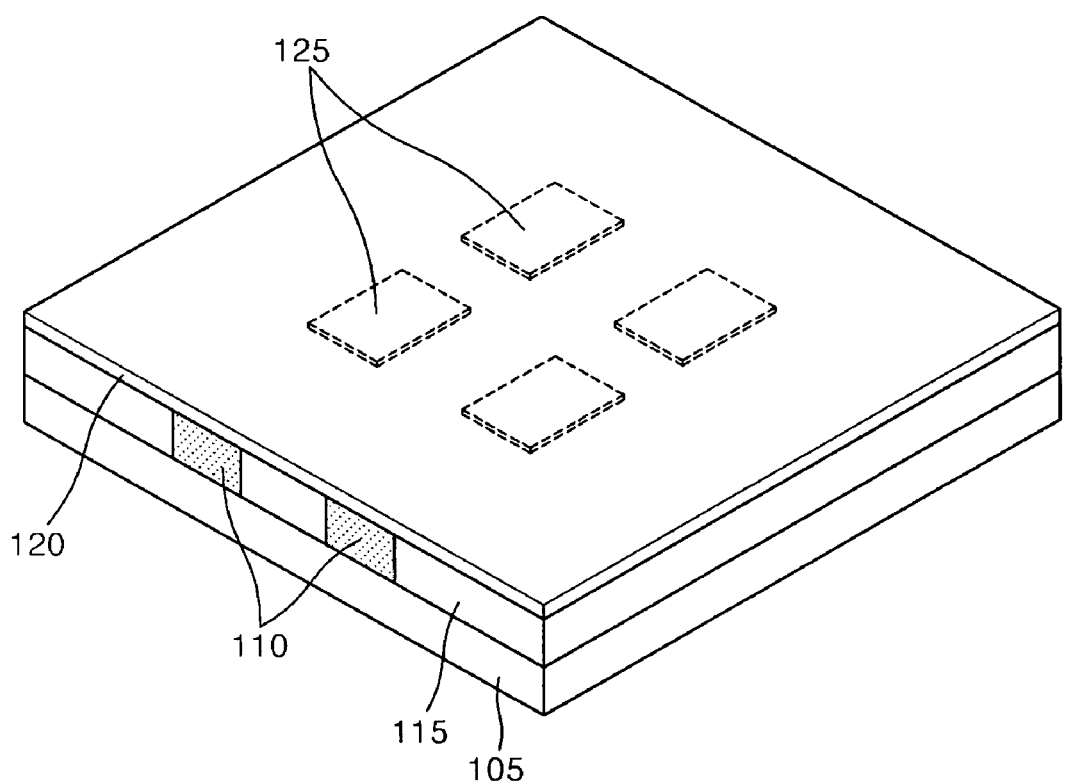

Referring to FIG. 12, at least one charge storage layer 125 and an interlayer insulating layer 120 may be formed on the bottom gate electrodes 110. For example, a stacking structure of a blocking insulating layers 122, charge storage layers 125, and tunneling insulating layers 130 may be formed on the bottom gate electrodes 110, as shown in FIG. 3. The charge storage layer 125 may be patterned to a plurality of charge storage layers 125 after being formed in one layer on the blocking insulating layers 122.

The tunneling insulating layers 130 and the blocking insulating layers 122 may be referred to as an interlayer insulating layer 120. The tunneling insulating layer 130 and the blocking insulating layer 122 may be patterned to a plurality of tunneling insulating layers 130 and blocking insulating layers 122 in the same manner as the charge storage layers 125.

Figure 13:
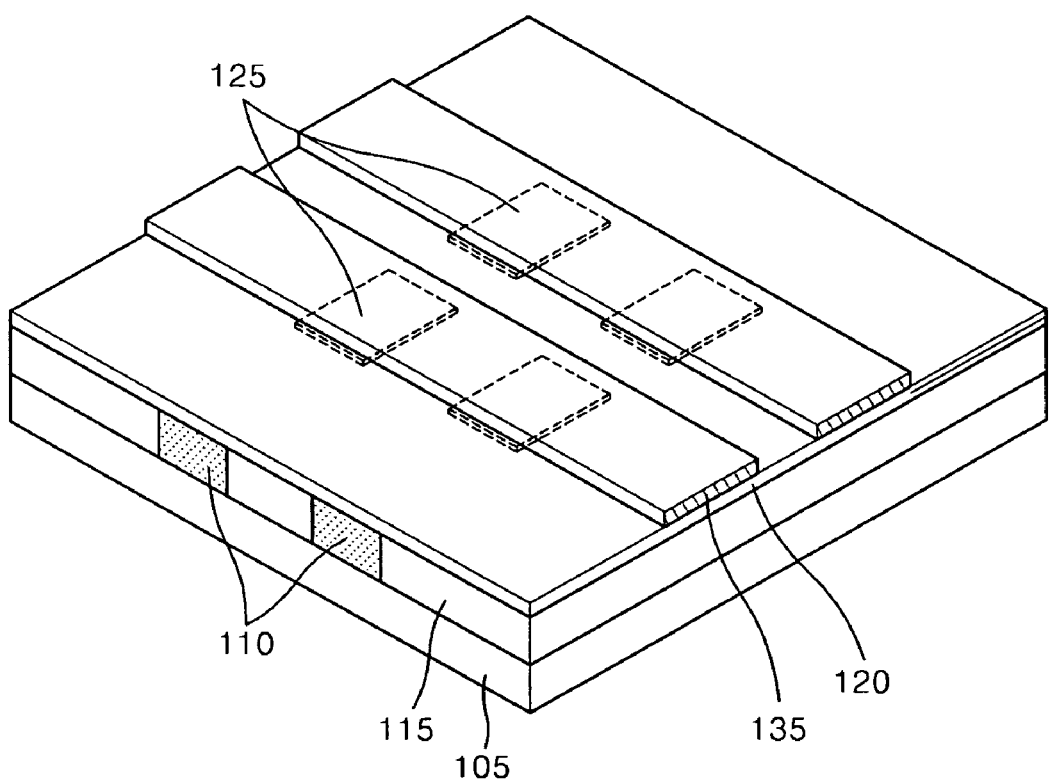

Referring to FIG. 13, at least one semiconductor channel layer 135 may be formed on the interlayer insulating layer 120. For example, the semiconductor channel layers 135 may be formed by patterning a semiconductor material layer deposited on the interlayer insulating layer 120. The semiconductor channel layers 135 may cross the bottom gate electrodes 110.

Figure 14:
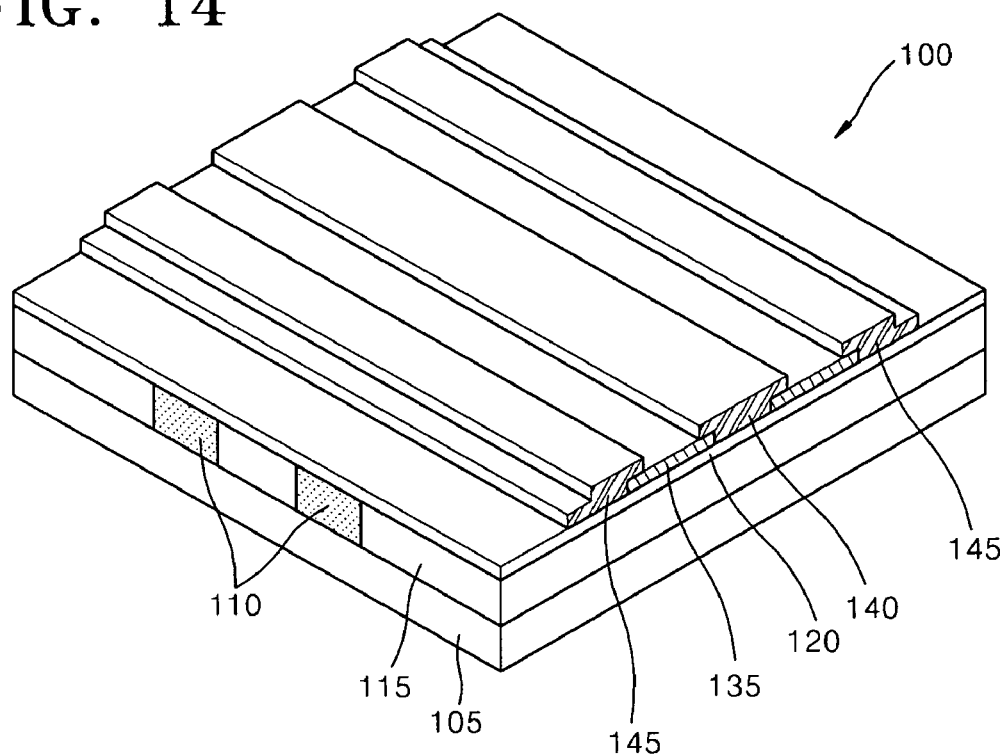

Referring to FIG. 14, at least one source electrode 140a and at least one drain electrode 145a may be formed on both sides of the semiconductor channel layers 135. The source electrodes 140a and the drain electrodes 145a may be separately electrically connected to both side surfaces of the semiconductor channel layers 135 or to both edges of the semiconductor channel layers 135.

For example, the source electrodes 140a and the drain electrodes 145a can be formed by patterning an electrode material deposited on the semiconductor channel layers 135. The electrode material may be selected from the group including IZO, ITO, Ti/Au, Mo, Ru, Al, Pt/Ti, Al/Au, and Cu.

As example embodiments of the method provide, the nonvolatile memory device 100 having a three-dimensional structure may be fabricated using a thin film technique, without using a SOI substrate or a bonding technique.

Example embodiments of the method of fabricating the nonvolatile memory device 100 may also be applied to fabricate the nonvolatile memory device 100a of FIG. 4. For example, in FIG. 14, after forming a separation insulating layer 132 (not shown) that fills spaces between the semiconductor channel layers 135, the source electrodes 140 and the drain electrodes 145 may be formed on the separation insulating layer 132. The separation insulating layer 132 may be formed by deposition and planarization.

Figure 15:
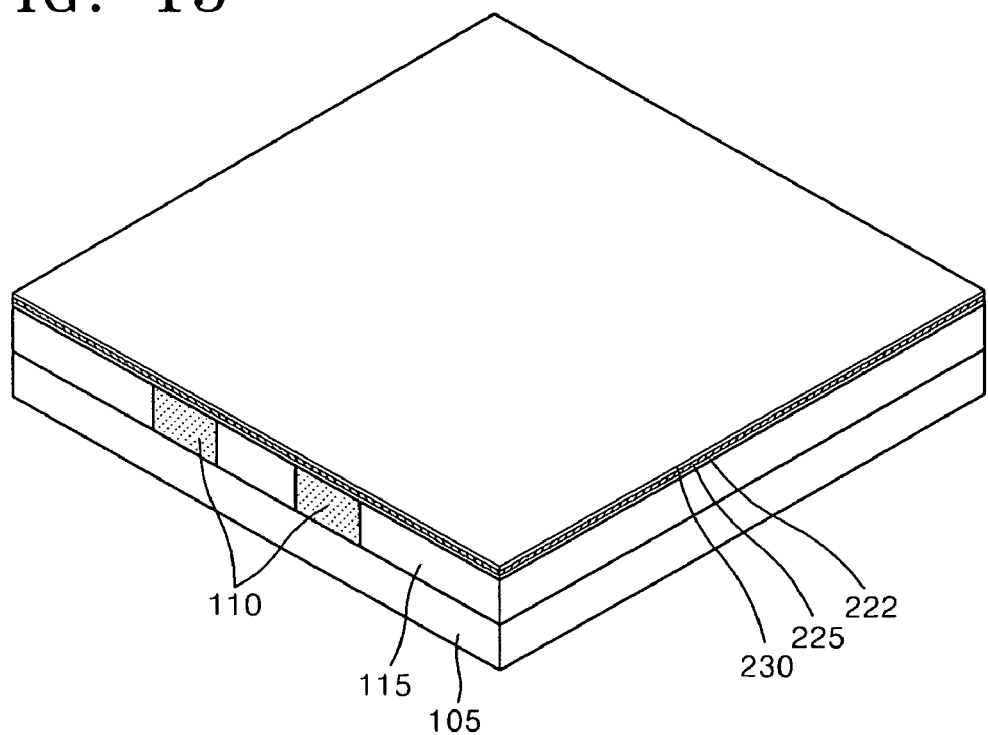
FIGS. 15 through 17 are schematic perspective views for explaining a method of fabricating a nonvolatile memory device according to example embodiments.
Figure 16:
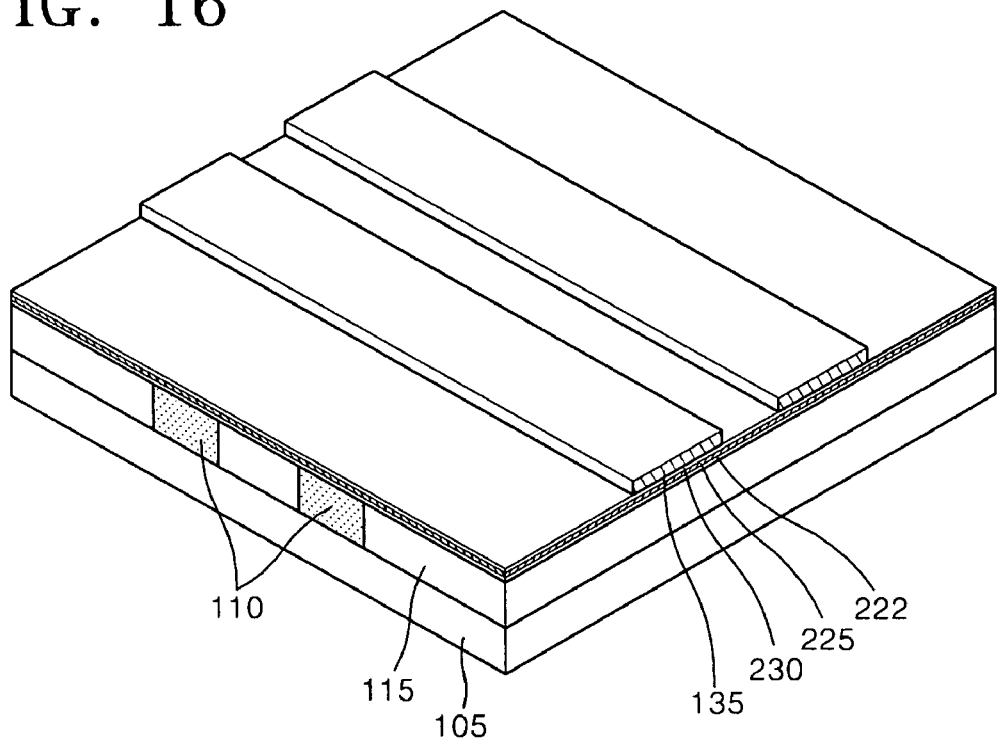
Figure 17:
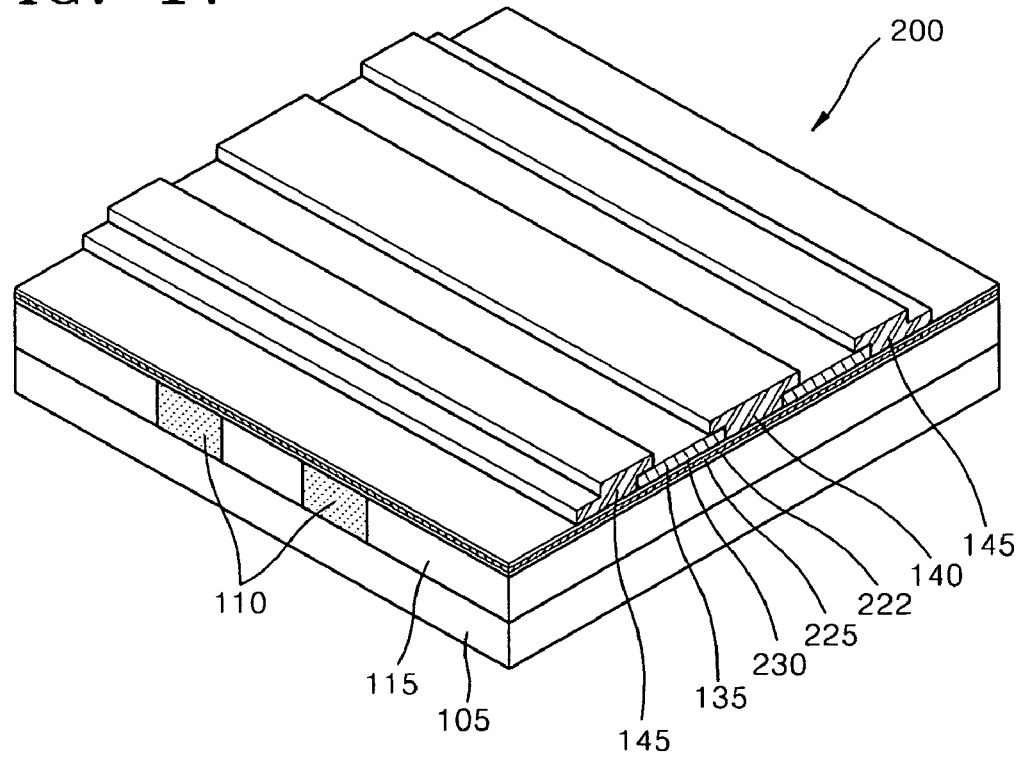

FIGS. 15 through 17 are schematic perspective views for explaining a method of fabricating a nonvolatile memory device 200 according to example embodiments. The nonvolatile memory device 200 may be fabricated using example embodiments of the method of fabricating the nonvolatile memory device 100 described with reference to FIGS. 10 and 11, and the description of elements identical to previously discussed example embodiments will not be repeated.

Referring to FIG. 15, a blocking insulating layer 222 may be formed on bottom gate electrodes 110, a charge storage layer 225 may be formed on the blocking insulating layer 222, and a tunneling insulating layer 230 may be formed on the charge storage layer 225.

Referring to FIG. 16, semiconductor channel layers 135 may be formed on the tunneling insulating layer 230. For example, the semiconductor channel layers 135 may cross the bottom gate electrodes 110.

Referring to FIG. 17, source electrodes 140 and drain electrodes 145 may be formed on both sides of the semiconductor channel layers 135. The source electrodes 140 and the drain electrodes 145 may be separately electrically connected to both side surfaces of the semiconductor channel layers 135 or to both edges of the semiconductor channel layers 135.

Example embodiments of the method of fabricating the nonvolatile memory device 200 may also be applied to fabricate the nonvolatile memory device 200a of FIG. 9. For example, in FIG. 17, after forming a separation insulating layer 232 that fills spaces between the semiconductor channel layers 135, the source electrodes 140 and the drain electrodes 145 may be formed on the separation insulating layer 232. The separation insulating layer 232 may be formed by patterning an appropriate insulating layer formed on the semiconductor channel layers 135.

Figure 18:
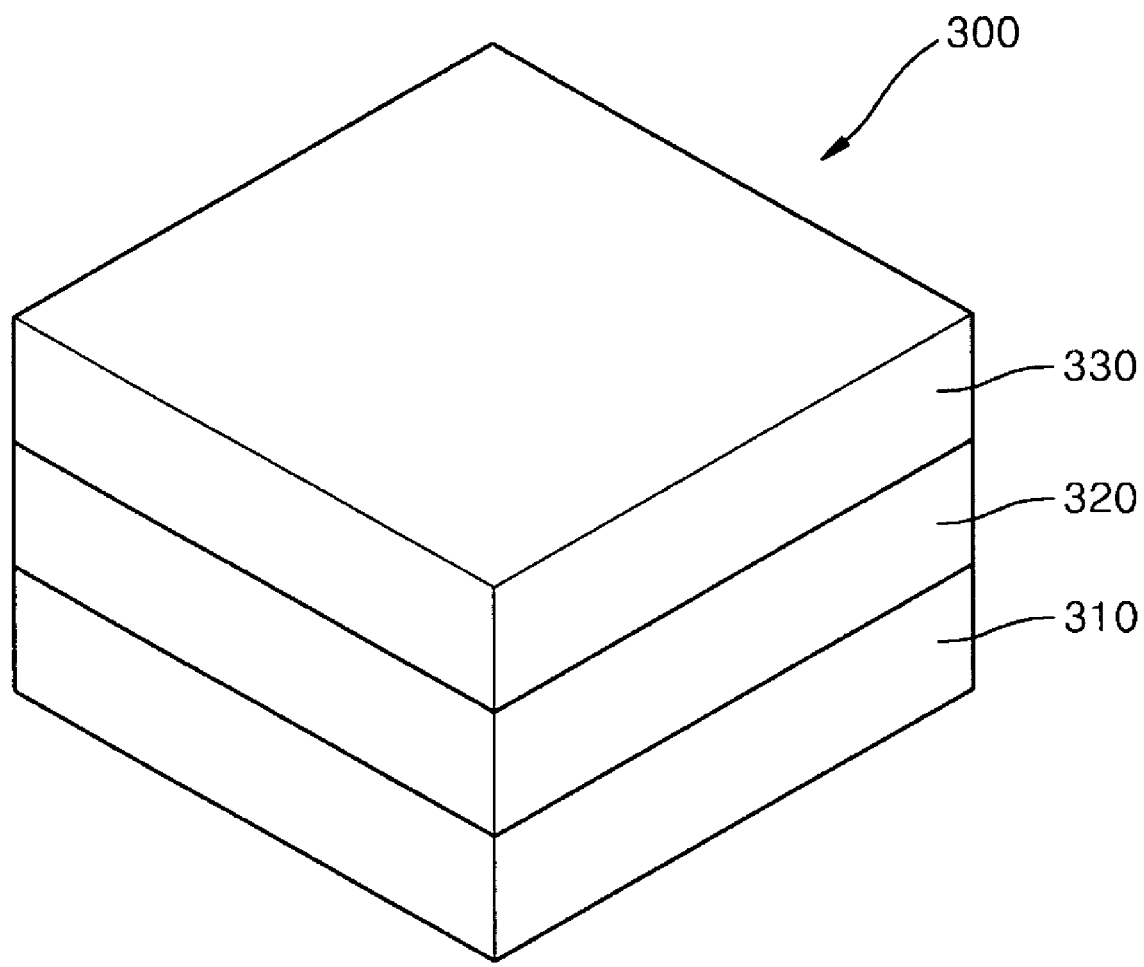
FIG. 18 is a schematic perspective view of a stack module according to example embodiments.

FIG. 18 is a schematic perspective view of a stack module 300 according to example embodiments.

Referring to FIG. 18, a plurality of unit modules 310, 320, and 330 may be stacked. The unit modules 310, 320, and 330 may have an identical structure to at least one of the nonvolatile memory devices 100, 100a, 200, and 200a. Accordingly, the stack module 300 may be one of the nonvolatile memory devices 100, 100a, 200, and 200a extended to a three-dimensional structure.

Example embodiments provide that the nonvolatile memory devices 100, 100a, 200, and 200a may be stacked using a thin film technique and that the unit modules 310, 320, and 330 may be disposed in the stack module 300. The stack module 300 may have a higher integration density since the stack module 300 includes the unit modules 310, 320, and 330 disposed in a plurality of layers on the same plane. The integration density of the stack module 300 may also be increased by increasing the number of stacking unit modules 310, 320, and 330.

Experimental results of obtained according to example embodiments will be further described with reference to FIGS. 19 through 22. In the experiments, Mo was used as the bottom gate electrodes 110, charge-trap type silicon nitride was used as the charge storage layer 225, and amorphous-GIZO was used as the semiconductor channel layers 135.

Figure 19:
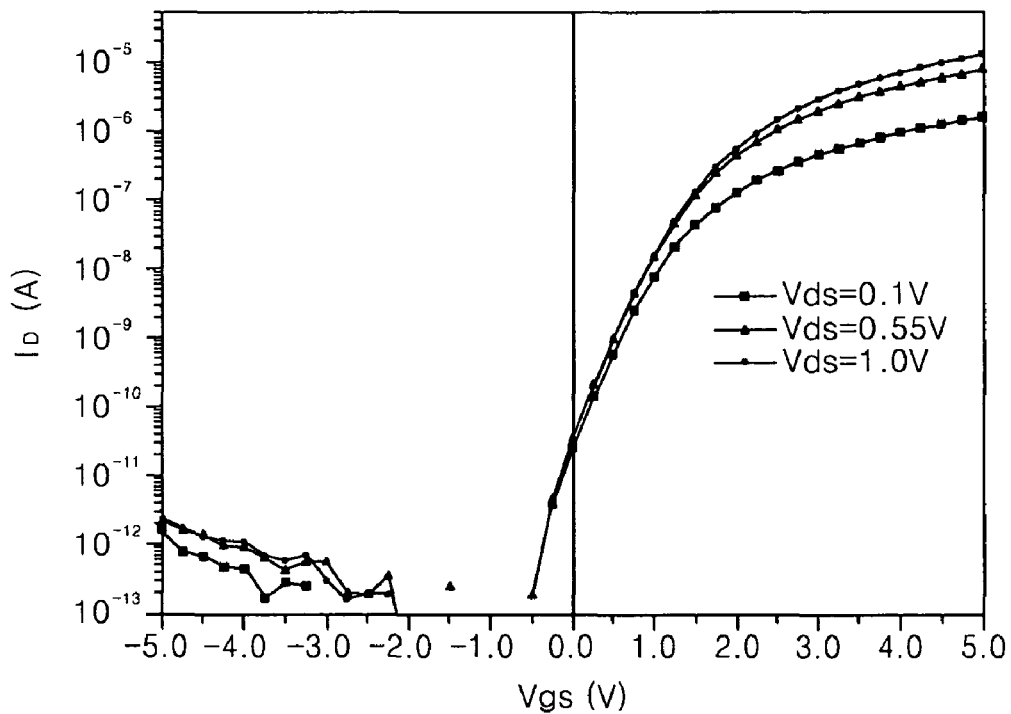
FIGS. 19 and 20 are graphs showing experiment results of voltage-current characteristics of a nonvolatile memory device according to example embodiments.
Figure 20:
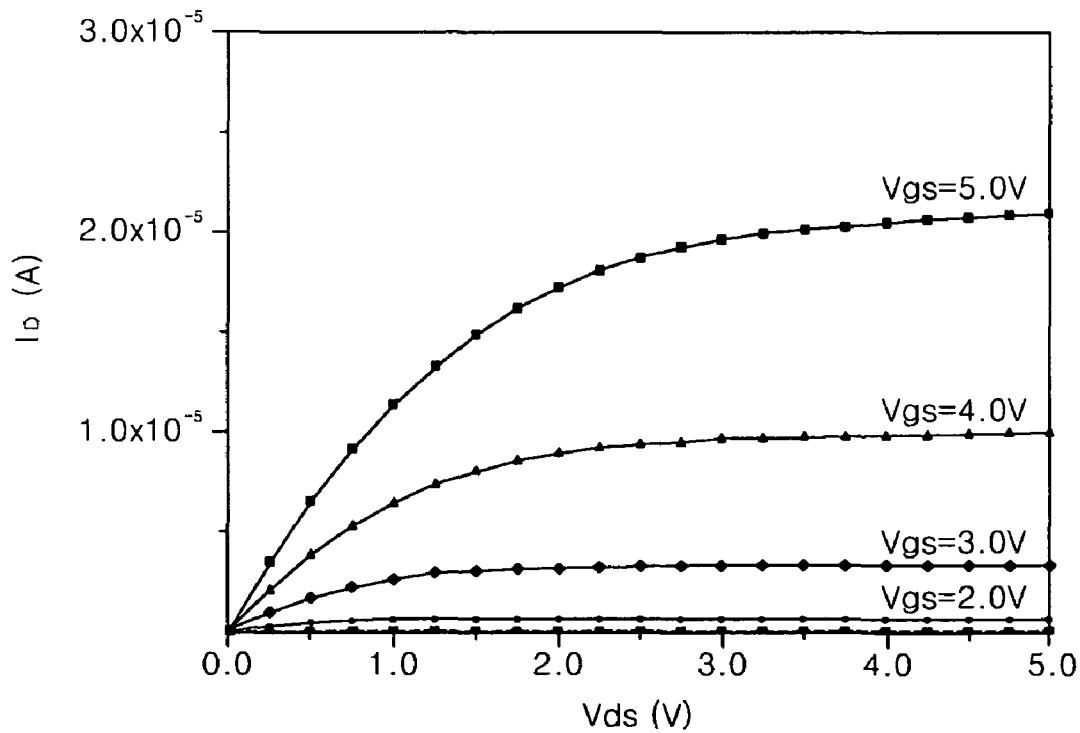

FIGS. 19 and 20 are graphs showing experimental results of voltage-current characteristics of a nonvolatile memory device according to example embodiments.

Referring to FIG. 19, the characteristics of drain current ID according to gate voltage Vgs are shown. The gate voltages Vgs are applied to the bottom gate electrodes 110, and the drain currents ID are measured at the drain electrodes 145. Drain voltages Vds of 0.1V, 0.55V, and 1.0V are sequentially applied to the drain electrodes 145. If the gate voltage Vgs is greater than approximately −0.5V, drain current ID increases. The drain current ID according to the gate voltage Vgs and the drain voltage Vds may be similar to the characteristics of a conventional transistor.

Referring to FIG. 20, the characteristics of drain current ID according to drain voltage Vds are shown. Gate voltages Vgs of 2.0V, 3.0V, 4.0V, and 5.0V are sequentially applied to the bottom gate electrodes 110. The drain current ID according to the gate voltage Vgs and the drain voltage Vds may be similar to the characteristics of a conventional transistor.

Figure 21:
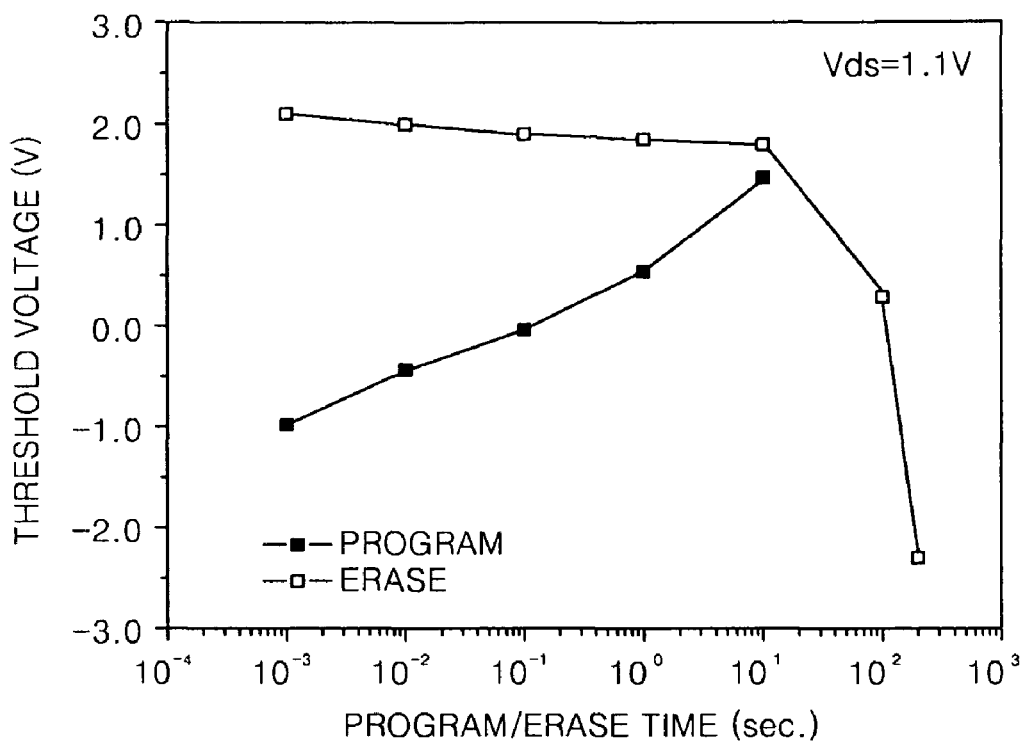
FIG. 21 is a graph showing an experiment result of program/erase characteristics of a nonvolatile memory device according to example embodiments.

FIG. 21 is a graph showing experimental results of program/erase characteristics of a nonvolatile memory device according to example embodiments.

Referring to FIG. 21, the variation of threshold voltage according to program/erase time is shown when the drain voltage is 1.1V. A program voltage was maintained at 20V, and an erase voltage was maintained at −20V. It is seen that the threshold voltage is gradually increased as the program maintaining time passes. For example, if the program time is approximately 10 seconds, the threshold voltage has increased by approximately 2.5V. Thus, a programming operation may be possible using a nonvolatile memory device.

As the erase maintaining time passes, the threshold voltage is slowly reduced for 10 seconds, afterwards, is rapidly reduced. If the erase maintaining time is approximately 100 seconds, the threshold voltage is reduced by approximately −2.0V. Thus, an erasing operation may be possible using a nonvolatile memory device.

Figure 22:
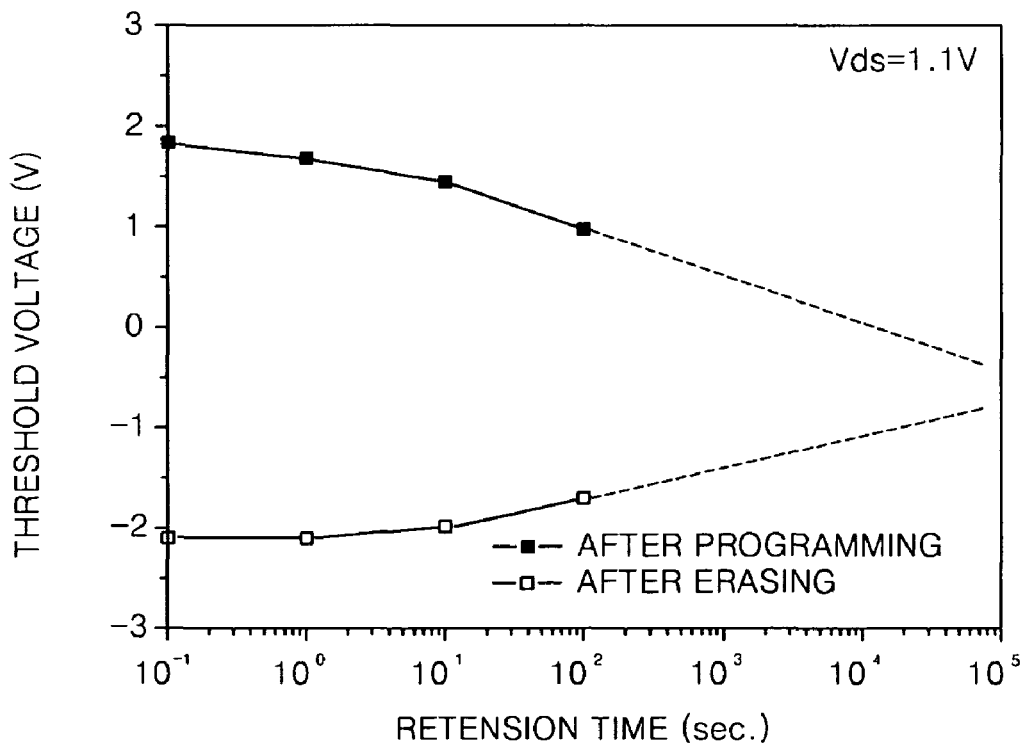
FIG. 22 is a graph showing an experiment result of retention characteristics of a nonvolatile memory device according to example embodiments.

FIG. 22 is a graph showing experimental results of retention characteristics of a nonvolatile memory device according to example embodiments.

Referring to FIG. 22, it is seen that the variation of threshold voltage when the drain voltage Vds is 1.1V. As the retention time passes after programming, the threshold voltage is slowly reduced, and as the retention time passes after erasing, the threshold voltage is slowly increased. It is seen that, after approximately $10^4$ seconds of retention times has elapsed, a window with respect to programming and erasing operation may be approximately 1V.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A nonvolatile memory device having an inverted structure, comprising:
    a substrate having a top surface extending in an x-direction and a y-direction;
    at least one bottom gate electrode extending in the x-direction parallel to the top surface of the substrate,
    at least one charge storage layer on the at least one bottom gate electrode,
    at least one semiconductor channel layer on the at least one charge storage layer, the at least one semiconductor channel layer extending in the y-direction perpendicular to the x-direction and crossing at least two bottom gate electrodes,
    at least one source electrode, and at least one drain electrode, wherein the at least one source electrode and the at least one drain electrode cross the at least two bottom gate electrodes and extend in the y-direction.

2. The nonvolatile memory device of claim 1, wherein the at least one source electrode and the at least one drain electrode are separately electrically connected to the at least one semiconductor channel layer.

3. The nonvolatile memory device of claim 2, wherein the at least one source electrode and the at least one drain electrode extend on the at least one semiconductor channel layer from both sides of the at least one semiconductor channel layer.

4. The nonvolatile memory device of claim 2, wherein the at least one source electrode and the at least one drain electrode are spaced apart on the at least one semiconductor channel layer.

5. The nonvolatile memory device of claim 1, further including at least one tunneling insulating layer between the at least one semiconductor channel layer and the at least one charge storage layer.

6. The nonvolatile memory device of claim 1, further including at least one blocking insulating layer between the at least one charge storage layer and the at least one bottom gate electrode.

7. The nonvolatile memory device of claim 1, wherein the at least one charge storage layer is of a floating gate type.

8. The nonvolatile memory device of claim 7, wherein the at least one charge storage layer includes a poly-silicon or a metal.

9. The nonvolatile memory device of claim 1, wherein the at least one charge storage layer is of a charge-trap type.

10. The nonvolatile memory device of claim 9, wherein the at least one charge storage layer includes at least one of silicon nitrides, nanocrystals, and quantum dots.

11. The nonvolatile memory device of claim 1, wherein the at least one semiconductor channel layer includes a semiconductor oxide.

12. The nonvolatile memory device of claim 11, wherein the semiconductor oxide includes at least one of a zinc oxide, a tin oxide, an indium tin oxide (ITO), an indium zinc oxide (IZO), a copper oxide, a nickel oxide, a titanium oxide, a (aluminum, gallium, or indium)-doped zinc oxide, (nitrogen, phosphorus, arsenic)-doped zinc oxide, and an amorphous gallium indium zinc oxide (GIZO).

13. The nonvolatile memory device of claim 1, wherein the at least one semiconductor channel layer includes at least one of an amorphous silicon, a poly-silicon, an epitaxial silicon, germanium, and a polymer.

14. The nonvolatile memory device of claim 1, wherein the at least one bottom gate electrode includes a plurality of bottom gate electrodes separated from each other on the substrate, and the at least one semiconductor channel layer includes a plurality of semiconductor channel layers disposed on the bottom gate electrodes.

15. The nonvolatile memory device of claim 14, wherein the at least one charge storage layer includes a plurality of charge storage layers separately interposed between the plurality of bottom gate electrodes and between the plurality semiconductor channel layers.

16. The nonvolatile memory device of claim 14, wherein the at least one charge storage layers are of floating gate type.

17. The nonvolatile memory device of claim 14, wherein the at least one charge storage layer includes one charge storage layer interposed between the plurality of bottom gate electrodes and the plurality of semiconductor channel layers.

18. The nonvolatile memory device of claim 17, wherein the one charge storage layer is of a charge-trap type.

19. The nonvolatile memory device of claim 14, further including a plurality of source electrodes and drain electrodes separately electrically connected to both sides of the plurality of semiconductor channel layers.

20. The nonvolatile memory device of claim 19, wherein the plurality of source electrodes and the plurality of drain electrodes cross the plurality of bottom gate electrodes.

21. A stack module comprising:
  a plurality of stacked nonvolatile memory devices of claim 1.

22. A method of fabricating a nonvolatile memory device, comprising:
  providing a substrate having a top surface extending in an x-direction and a y-direction,
  forming at least one bottom gate electrode on a substrate such that the at least one bottom gate electrode extends in the x-direction,
  forming at least one charge storage layer on the at least one bottom gate electrode,
  forming at least one semiconductor channel layer on the at least one charge storage layer such that the at least one semiconductor channel layer extends in the y-direction perpendicular to the x-direction and crosses at least two bottom gate electrodes,
  forming at least one source electrode, and
  forming at least one drain electrode electrically, wherein the at least one source electrode and the at least one drain electrode cross the at least two bottom gate electrodes and extend in the y-direction.

23. The method of claim 22, wherein the at least one source electrode and the at least one drain electrode are electrically connected to both sides of the at least one charge storage layer.

24. The method of claim 22, prior to forming the at least one charge storage layer, further comprising:
  forming at least one blocking insulating layer on the at least one bottom gate electrode.

25. The method of claim 22, prior to forming the at least one semiconductor channel layer, further comprising:
  forming at least one tunneling insulating layer on the at least one charge storage layer.

26. The method of claim 22, wherein forming the at least one bottom gate electrode includes forming a plurality of bottom gate electrodes separated from each other on the substrate, and
  forming the at least one semiconductor channel layer includes forming a plurality of semiconductor channel layers on the at least one charge storage layer.

27. The method of claim 26, after forming the semiconductor channel layers, further comprising:
  forming a plurality of source electrodes and a plurality of drain electrodes separately electrically connected to both sides of the plurality of semiconductor channel layers.

28. The method of claim 26, wherein forming the at least one charge storage layer includes forming a plurality of charge storage layers so that the plurality of charge storage layers are separately interposed between the plurality of bottom gate electrodes and between the plurality of semiconductor channel layers.

29. The method of claim 26, wherein forming the at least one charge storage layer includes forming one charge storage layer interposed between the plurality of bottom gate electrodes and the plurality of semiconductor channel layers.

* * * * *